(12) United States Patent
Ohhashi et al.

(10) Patent No.: US 8,770,989 B2
(45) Date of Patent: Jul. 8, 2014

(54) ELECTRONIC CONTROL DEVICE

(75) Inventors: Hironori Ohhashi, Isesaki (JP); Yuichi Yanagisawa, Maebashi (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 3 days.

(21) Appl. No.: 13/609,684

(22) Filed: Sep. 11, 2012

(65) Prior Publication Data

US 2013/0072040 A1   Mar. 21, 2013

(30) Foreign Application Priority Data

Sep. 21, 2011   (JP) ................................. 2011-205475

(51) Int. Cl.
*H01R 12/00*   (2006.01)
(52) U.S. Cl.
USPC ......................... 439/76.1; 439/589; 439/936
(58) Field of Classification Search
USPC ......... 439/79, 76.1, 76.2, 519–521, 587, 589, 439/936
See application file for complete search history.

(56) References Cited

U.S. PATENT DOCUMENTS

| 7,744,381 B2 * | 6/2010 | Honda | 439/79 |
| 2009/0068862 A1 | 3/2009 | Honda | |

FOREIGN PATENT DOCUMENTS

| JP | 2005-327643 A | 11/2005 |
| JP | 2009-70855 A | 4/2009 |
| JP | 2009-117285 A | 5/2009 |
| JP | 2010-258360 A | 11/2010 |
| JP | 2011-49312 A | 3/2011 |
| JP | 2011-60618 A | 3/2011 |

OTHER PUBLICATIONS

Japanese Office Action Dated Aug. 13, 2013 (Two (2) Pages).
U.S. Appl. No. 13/609,555, filed Sep. 11, 2012.
U.S. Appl. No. 13/609,597, filed Sep. 11, 2012.

* cited by examiner

*Primary Examiner* — Khiem Nguyen
(74) *Attorney, Agent, or Firm* — Crowell & Moring LLP

(57) ABSTRACT

An electronic control device has a circuit board to which, at one side thereof, a connector is fixed; a housing having a pair of connector sandwiching members that sandwich the connector, a part of the connector being exposed to an outside of the housing and a remaining part of the connector and the circuit board being housed in a watertight space of the housing, and one of the connector sandwiching members being set to be higher in rigidity than the other; a seal portion filled with a sealant; and a shift suppression unit having a protruding portion formed at one side of the higher-rigidity connector sandwiching member and the connector and a hollow portion formed at the other side The shift suppression unit suppresses a shift of the connector with respect to the housing by fitting of the protruding portion and the hollow portion together.

4 Claims, 6 Drawing Sheets

ELECTRONIC CONTROL DEVICE

BACKGROUND OF THE INVENTION

The present invention relates to an electronic control device which is favorable for an engine control unit or an automatic transmission control unit.

As an example of the electronic control device, it is disclosed in Japanese Patent Provisional Publication No. 2009-070855 (hereinafter is referred to as "JP2009-070855"). In JP2009-070855, a so-called connector-side-mounted type of electronic control device, in which a part of the connector fixed to one side of a circuit board is exposed to an outside of a housing from a window of the housing, is disclosed. Both upper and lower surfaces of the connector are sandwiched between and by a pair of connector sandwiching members of the housing from width direction of the circuit board. A fitting surface portion between periphery edges of a pair of these connector sandwiching members and also a fitting surface portion between an outer peripheral surface of the connector and an inner peripheral surface of the housing are provided with a seal portion filled with a sealing material (sealant) that serves also as an adhesive.

As the sealant, a silicone adhesive is generally used. The silicone adhesive has such shape-retaining nature that shape of the silicone adhesive before hardening just after application of the silicone adhesive does not change, and has such moderate plasticity as to fit to a shape of non-adhesion part when pressed until the silicone adhesive reaches a certain thickness.

SUMMARY OF THE INVENTION

In JP2009-070855, however, a great pressing force is applied to the connector when forcing (twisting) and connecting an external connector to this connector. In addition, a great load tends to be exerted on the connector due to weight and sway (or swing) of a harness. Because of this, if the connector moves or shifts with respect to the housing, it becomes difficult to ensure sealing performance at the seal portion provided at the fitting surface portion between the periphery edges of a pair of the connector sandwiching members and the fitting surface portion between the outer peripheral surface of the connector and the inner peripheral surface of the housing. A measure against this problem has been required.

For the above problem, it is therefore an object of the present invention to provide an electronic control device which is excellent in load-carrying capacity and capable of suppressing the shift of the connector with respect to the housing.

According to one aspect of the present invention, an electronic control device comprises: a circuit board to which, at one side thereof, a connector is fixed; a housing having a pair of connector sandwiching members that sandwich the connector in a thickness direction, a part of the connector being exposed to an outside of the housing and a remaining part of the connector and the circuit board being housed in a watertight space of an inside of the housing, and one of a pair of the connector sandwiching members being set to be higher in rigidity than the other; a seal portion formed at a fitting surface portion between periphery edges of a pair of the connector sandwiching members and at a fitting surface portion between an outer peripheral surface of the connector and an inner peripheral surface of the housing, the seal portion being filled with a sealant; and a shift suppression unit having fitting portions that are provided at the higher-rigidity connector sandwiching member and at the connector, the shift suppression unit suppressing a shift of the connector with respect to the housing by fitting of the fitting portions each other.

The other objects and features of this invention will become understood from the following description with reference to the accompanying drawings.

BRIEF DESCRIPTION OF THE DRAWINGS

FIG. 4A is a sectional view, taken along an A-A line of FIG. 1, of a lower surface side of the connector. FIG. 4B is a sectional view, taken along a B-B line of FIG. 1, of a side surface side of the connector. FIG. 4C is a sectional view, taken along a C-C line of FIG. 1, of an upper surface side of the connector.

DETAILED DESCRIPTION OF THE INVENTION

Figure 1:
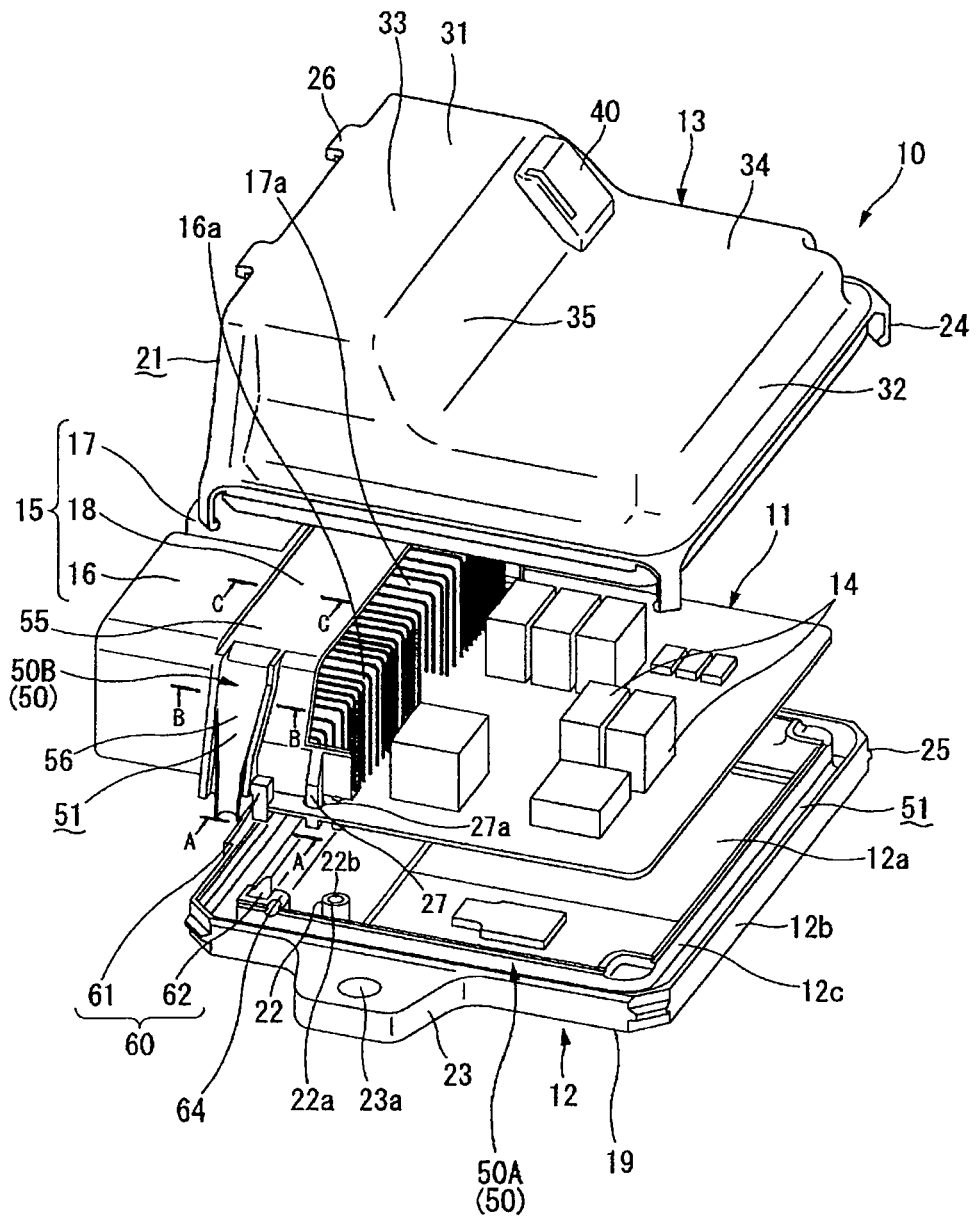
FIG. 1 is a perspective exploded view of an electronic control device having a seal structure, of a first embodiment of the present invention.

According to the present invention, the shift of the connector with respect to the housing is effectively suppressed by a shift suppression unit, and the load-carrying capacity is increased. It is therefore possible to suppress a decrease in the sealing performance which is caused by the shift of the connector.

Embodiments of an electronic control device of the present invention will now be explained below with reference to the drawings. In the following description, a case where the electronic control device is employed for an engine control unit of a vehicle will be explained in detail.

FIGS. 1 to 7 show the electronic control device of a first embodiment of the present invention.

First, a basic configuration of an electronic control device 10 will be explained with reference to FIGS. 1 and 2. Here, for convenience of the explanation, an up-and-down direction (a vertical direction) in FIG. 1, i.e. a thickness direction of a circuit board 11, is defined as an up-and-down direction (a vertical direction) and a height direction of the electronic control device 10. However, this direction does not necessarily correspond to a vertical direction when mounted in the vehicle.

The electronic control device 10 mainly has a housing formed by a substantially plate-shaped case 12 and a substantially box-shaped cover 13 and the circuit board 11 on which an electron element or component (or electronic parts) 14 is mounted. The case 12 that is fixed to a vehicle body side and the cover 13 are liquid-tightly fitted together, then the housing having the liquid tightness is formed. The circuit board 11 (the electronic parts 14) is housed in a watertight space of an inside of the housing. The electronic control device 10 is installed inside an engine room (not shown) etc. with a clamping or mounting flat surface 19, which is a bottom surface of the case 12, fixed to the vehicle body side.

Each element or component will be explained in more detail. The circuit board 11 is a so-called printed circuit board that mounts some electronic parts 14 on its front and/or back surfaces. Wiring circuit pattern is formed on plate-shaped front and/or back surfaces made of e.g. glass epoxy resin or is formed inside the front and/or back surfaces, then the electronic parts 14 are electrically connected to the wiring circuit pattern with solder. As the electronic parts 14, for instance, they are a capacitor, a coil, a transistor, an IC and so on. In FIG. 1, for the sake of convenience, only electronic parts 14 whose heat-generation is relatively high (e.g. MOS-FET and IC) are illustrated.

As shown in FIG. 1, a surface-mounted-type of connector 15 having first and second connecting opening ends 16 and 17 is attached or fixed to one side of the circuit board 11. Two of the first and second connecting opening ends 16, 17 are connected to respective external connectors 70 (see FIG. 6). This connector 15 is a connector that is made of synthetic resin by which the two connecting opening ends 16, 17 split according to the external connectors are integrally joined together through a joining base 18. The connector 15 is fixed to the circuit board 11 through this joining base 18 with a plurality of screws etc. The connector 15 is arranged so that a series of connecting opening ends 16, 17 joined by the joining base 18 face an outside through a window 21 that is an opening formed between the case 12 and the cover 13. The connecting opening ends 16, 17 are connected to the respective external connectors 70 at this window 21. These connecting opening ends 16, 17 and the joining base 18 of the connector 15 are integrally formed together by synthetic resin material.

The connector 15 is provided with a plurality of male terminals 16a and 17a that are electrically connected to the wiring circuit pattern on the circuit board 11. These male terminals 16a, 17a are respectively connected to a plurality of female terminals housed in the external connectors (not shown), the connector 15 is thus electrically connected to sensors and equipment such as a pump, each of which is connected to the external connector (the female terminal).

The case 12 is a case that is formed into the substantially plate-shape by metal material such as iron and aluminum having excellent heat-dissipation. More specifically, the case 12 is formed, as an integral part, into such a shallow-bottomed box-shape that a periphery edge of the case 12 slightly stands. As shown in FIG. 1, a side wall 12b is formed at an outer periphery edge (at each side) of a substantially rectangular bottom wall 12a in such a manner that the whole of case 12 slightly opens upwards.

Further, a board fixing portion 22 for fixing the circuit board 11 is provided on an inner side surface of the bottom wall 12a of the case 12. The board fixing portion 22 has, on an upper end thereof, a flat supporting surface 22a that supports the circuit board 11, and a female screw hole 22b into which a screw (not shown) is screwed for fixing the circuit board 11 is formed at the supporting surface 22a. The screw is screwed into each female screw hole 22b, thereby fixing the circuit board 11 to the case 12 with the circuit board 11 supported by each board fixing portion 22.

Furthermore, a pair of brackets 23 for fixing the electronic control device 10 to the vehicle body (not shown) are formed integrally with an outer side part of the side wall 12b of the case 12. Here, in FIG. 1, only one bracket 23 positioned at a front side in the drawing is illustrated. The bracket 23 is provided with a penetration hole 23a that penetrates the bracket 23 in the vertical direction and a cutting groove that opens towards the side of the case 12. The electronic control device 10 is fixed to the vehicle body side with a bolt that is inserted in the penetration hole 23a and the cutting groove.

The cover 13 is a cover that is formed, as an integral part, into the substantially box-shape by certain synthetic resin material that is light and low cost as compared with metal material. The cover 13 has an upper wall 31 that covers an upper side of the circuit board 11 and an upper side of the connector 15 and a side wall 32 that surrounds three sides of a periphery edge of the upper wall 31 except the window 21. A stopper hook 24 provided at each of four corners of the cover 13 is fitted onto a protrusion 25 provided at each of four corners of the case 12 by elastic deformation of the stopper hook 24, and also each connector stopper hook 26 provided at two positions of a periphery edge of the window 21 is fitted onto a protrusion (not shown) provided at the connector 15 side by elastic deformation of the connector stopper hook 26. The cover 13 is then firmly attached or secured to the case 12 and the circuit board 11 including the connector 15. A fixing structure of the cover 13 is such snap-fit type fixing structure as described above.

As explained above, in the present embodiment, as the fixing structure of the housing, the snap-fit type fixing structure which is a simple structure using the elastic deformation of the synthetic resin cover 13 is employed. However, the fixing structure is not limited to this structure. For instance, other fixing structure using a screw or a bolt could be used.

The joining base 18 of the connector 15 is provided with a positioning protrusion 27 that is inserted into a positioning hole 27a formed on the circuit board 11.

This electronic control device 10 employs a so-called connector-side-mounted structure in which a part of the connector 15 fixed to the one side of the circuit board 11 penetrates the window 21 provided at a side of the housing and is exposed to an outside of the housing. Because of this structure, the cover 13 has a stepped shape according to heights of the circuit board 11 and the connector 15 whose sizes (heights) in the thickness direction of the circuit board are different from each other. More specifically, the upper wall 31 of the cover 13, which faces the case 12 so as to sandwich the circuit board 11 and the connector 15, has an upper section 33 and a lower section 34, each of which is parallel to the mounting flat surface 19 of the case 12. A size (height) in the thickness direction of the circuit board of the upper section 33 that covers the upper side of the connector 15 is set to be larger (or higher) than that of the lower section 34 that covers the upper side of the circuit board 11. The upper wall 31 further has a sloped wall section 35 that smoothly or seamlessly unites these upper and lower sections 33 and 34 having different height. This sloped wall section 35 has a predetermined inclination angle with respect to the mounting flat surface 19 of the case 12. More specifically, the sloped wall section 35 inclines at a substantially 45-degree flat inclination angle. Therefore, the sloped wall section 35 inclines at the same inclination angle with respect to the upper section 33 and the lower section 34.

The sloped wall section 35, which serves as part of an exterior wall of the housing, is provided with a protection wall 40. An air vent (not shown) for ventilation of the inside of the housing is formed at an inner side of the protection wall 40 so as to penetrate the sloped wall section 35 in the thickness direction. The air vent is provided with a breathable waterproof thin film such as Gore-Tex (registered trademark) which has both water-resistance and air-permeability. The protection wall 40 covers the air vent and its surroundings in order to prevent the breathable waterproof thin film from being directly sprayed with high temperature-high pressure water during car wash etc.

In order to ensure the water-resistance of the inside of the housing, a seal portion 50 which is filled with a sealing material (sealant) that functions as an adhesive is provided at a fitting surface portion between the components. More specifically, a housing seal portion 50A filled with the sealant is provided at a fitting surface portion that is a mating surface portion between the periphery edge of an upper surface side of the case 12 and the periphery edge of a lower surface side of the cover 13 throughout the entire circumference of the housing. In addition, a connector seal portion 50B filled with the sealant is also provided at a fitting surface portion between an outer peripheral surface of the connector 15 and an inner peripheral surface of the window 21 of the housing throughout the entire circumference of the connector 15. The housing seal portion 50A and the connector seal portion 50B are a common seal portion at a lower surface side of the connector 15. That is, the seal portion 50 positioned under the connector 15 serves as a part of the housing seal portion 50A and also as a part of the connector seal portion 50B.

As the sealant, a sealant (adhesive) having such shape-retaining nature that shape of the adhesive before hardening just after application of the adhesive does not change and having such moderate plasticity and fluidity as to fit to a shape of non-adhesion part when pressed until the adhesive reaches a certain thickness, is used. For example, epoxide sealant, silicon sealant and acrylic sealant could be selected as the sealant in accordance with specs or requirements of the electronic control device 10.

Regarding the housing seal portion 50A, a channel-shaped seal groove 51 which is shaped like a square bracket ([) in cross section is formed at the case 12 side throughout the entire circumference of the case 12. Further, a band-shaped protruding line 52 whose cross section is a rectangle is formed at the lower surface side of the cover 13 and the lower surface side of the connector 15. This protruding line 52 is fitted in the seal groove 51 with a predetermined gap provided between the protruding line 52 and the seal groove 51. This gap is a U-shaped gap (U-shaped cross section gap, whose cross section is U-shape), and a sealing material (sealant) 53 fills this U-shaped gap.

Figure 2:
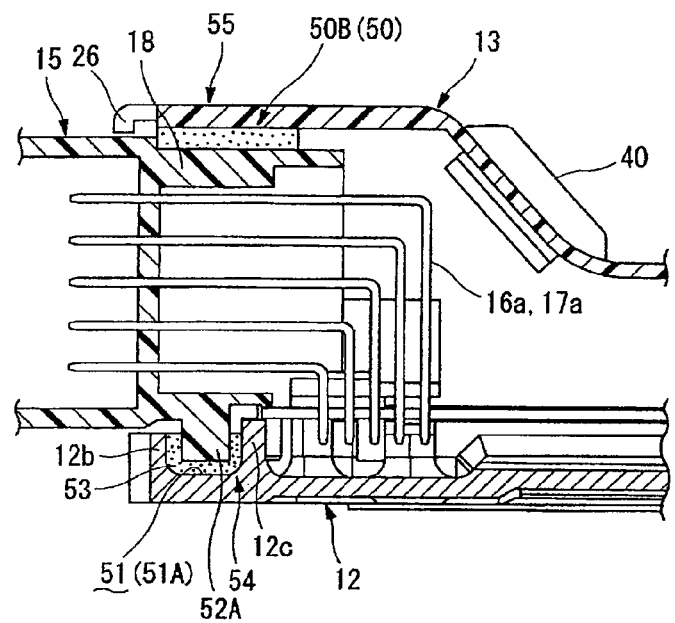
FIG. 2 is a sectional view of a connector part, of the first embodiment.

As shown in FIGS. 1 and 2, the seal groove 51 formed at the case 12 is defined between the side wall 12b of the case 12 and an auxiliary wall 12c that stands from the bottom wall 12a at an inner peripheral side of the side wall 12b. On the other hand, the protruding line 52 formed at the cover 13 is formed as an integral part upon molding the synthetic resin cover 13, and protrudes downwards from the lower surface of the cover 13. Likewise, the protruding line 52 formed at the connector 15 is formed as an integral part upon molding the synthetic resin connector 15, and protrudes downwards from a lower surface of the joining base 18 of the connector 15.

In this manner, the seal portion 50 is provided with the seal groove 51 and the protruding line 52, and the cross section of the gap filled with the sealant 53 is shaped into the U-shape, thereby securing a sufficient seal length (also called a leak path) and getting intended or desired sealing performance.

With respect to the housing seal portion 50A, a depth and a width of each of the seal groove 51 and the protruding line 52 are set to be substantially uniform throughout the entire circumference so as to secure a predetermined constant seal length.

Here, the "seal length" corresponds a filling length of the sealant existing between two gaps that are separated by the seal portion 50. For instance, in FIG. 4A, the seal length corresponds a length (R2+(R1×2)) obtained by developing or converting the U-shaped gap filled with the sealant 53 to a linear length.

As for the connector seal portion 50B, as same as the housing seal portion 50A, the seal groove 51 and the protruding line 52 are formed. Under the connector 15 (at the lower surface side of the connector 15) where the connector seal portion 50B serves also as a part of the housing seal portion 50A (and vice versa), as shown in FIG. 2, the protruding line 52 (52A) is provided at the connector 15 side, then this protruding line 52 (52A) is fitted in the seal groove 51 (51A) formed at the case 12. On the other hand, regarding surfaces (connector both sides) except the lower surface side of the connector 15, the seal groove 51 is formed at the connector 15 side, and the protruding line 52 is formed at the cover 13 side which faces this seal groove 51.

Figures 4A, 4B, 4C:
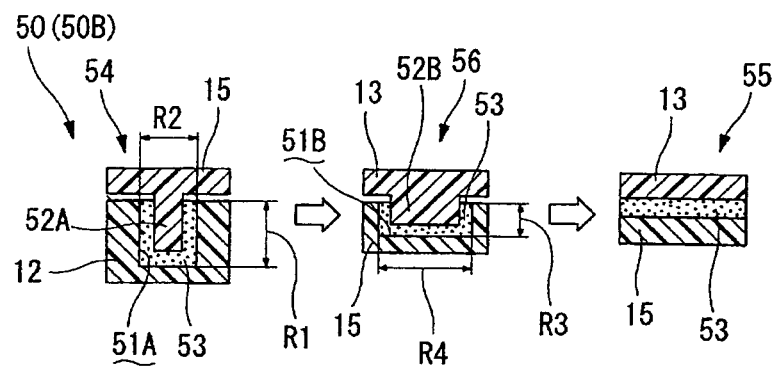
FIGS. 4A, 4B and 4C are sectional views of a connector seal portion under the assembly, of the first embodiment.

FIGS. 4A, 4B and 4C are sectional views of the connector seal portion 50B under the assembly. FIG. 4A is a sectional view, taken along an A-A line of FIG. 1, of the lower surface side of the connector 15. FIG. 4B is a sectional view, taken along a B-B line of FIG. 1, of the side surface side of the connector 15. FIG. 4C is a sectional view, taken along a C-C line of FIG. 1, of an upper surface side of the connector 15.

In the present embodiment, a shape and a size of each of the seal groove 51 and the protruding line 52 of the connector seal portion 50B are set to be different according to its position. That is, as shown in FIG. 4A, the lower surface side of the connector 15 is provided with a deep bottom portion 54 which has a seal groove 51A having a predetermined depth R1 and a predetermined width R2 and a band-shaped protruding line 52A fitted in this seal groove 51A with a gap provided between them. An inner surface of the seal groove 51A and an outer surface of the protruding line 52A of the deep bottom portion 54 face each other with a predetermined gap provided between them, then this U-shaped gap is filled with the sealant 53.

On the other hand, as shown in FIG. 4C, the upper surface side of the connector 15 is provided with a shallow bottom portion 55 whose seal groove and protruding line are set to be shallower than those of the deep bottom portion 54 formed at the lower surface side of the connector 15. Especially in the present embodiment, the depth of the seal groove is set to 0 (zero), namely that the seal groove is substantially omitted, and the protruding line fitted in the seal groove is also omitted. Thus, the upper surface side of the connector 15 which would be provided with the shallow bottom portion 55 is sealed by a so-called flat surface seal structure in which a flat band-shaped gap between the outer peripheral surface of the connector 15 and the opposing inner peripheral surface of the cover 13 of the housing is filled with the sealant 53.

As for the both sides of the connector 15, as shown in FIG. 4B, the side surface side of the connector 15 is provided with, at both sides thereof, a connecting portion 56 which connects the connector lower surface side deep bottom portion 54 and the connector upper surface side shallow bottom portion 55.

The deep bottom portion 54, the shallow bottom portion 55 and the connecting portion 56 are set in such a manner that the seal length of the connector seal portion 50B is constant throughout the entire circumference of the connector seal portion 50B (namely that the seal lengths at the deep bottom portion 54, the shallow bottom portion 55 and the connecting portion 56 are set so as to be constant). This will be explained in more detail. The widths of the seal groove and the protruding line of the shallow bottom portion 55 are set to be large as compared with the deep bottom portion 54 so that the both seal lengths are constant.

Further, although the connecting portion 56 is provided with a seal groove 51B and a band-shaped protruding line 52B fitted in this seal groove 51B with a predetermined gap provided as same as the deep bottom portion 54, a depth R3 of the seal groove 51B of the connecting portion 56 is set to be small (shallow) (i.e. R3<R1), also a width R4 of the seal groove 51B of the connecting portion 56 is set to be large (i.e. R4>R2), as compared with the deep bottom portion 54 so that the both seal lengths are constant. The protruding line 52B of the connecting portion 56 is also set according to such shape of the seal groove 51B. That is, a depth of the protruding line 52B is set to be small (shallow), also a width of the protruding line 52B is set to be large, as compared with the deep bottom portion 54.

Furthermore, regarding the connecting portion 56, as a position of the seal groove 51B gets closer to the deep bottom portion 54 from the shallow bottom portion 55, the depth R3 of the seal groove 51B is set to be gradually larger (deeper), and the width R4 of the seal groove 51B is set to be gradually smaller.

The seal structure of the side surface side of the connector 15 will be further explained. The side surface of the connector 15 is provided with a pair of ribs 57 that are formed as an integral part and overhang outwards. The seal groove 51B of the connecting portion 56 is formed between these ribs 57. Each of the ribs 57 has such substantially triangular-shape that an overhanging depth is gradually deeper towards the connector lower surface from the connector upper surface. A top of the rib 57 smoothly continues to the connector upper surface.

Further, an inner side of the seal groove 51B is provided with a further deeply hollow auxiliary seal groove 58, then the side surface side of the connector 15 has a dual seal structure. The auxiliary seal groove 58 is gradually deeper towards the connector lower surface, and extends up to an end surface of the connector lower surface protruding line 52A fitted in the seal groove 51 of the case 12. That is, a part of the auxiliary seal groove 58 is formed also at the end surface of the protruding line 52A of the lower surface side of the connector 15.

Next, a structure of a main part of the present invention will be explained.

As described above, the case 12 and the cover 13 form a pair of the connector sandwiching members of the housing which sandwich the connector 15 in the thickness direction. In the present embodiment, the case 12 which is one of the connector sandwiching members is formed by metal material such as aluminum alloy that has high rigidity. On the other hand, the cover 13 which is the other of the connector sandwiching members is formed, as an integral member by the molding, by synthetic resin material that is light and low cost.

Then, a shift suppression unit 60 having fitting portions 61, 62, which suppresses movement or shift of the connector 15 with respect to the housing by fitting of these fitting portions 61, 62, is provided. More specifically, as shown in the drawings (FIGS. 1 and 3 etc.), the shift suppression unit 60 has a protruding portion 61 integrally formed at the connector 15 and a hollow portion 62 formed at the higher-rigidity case 12. The protruding portion 61 is fitted in the hollow portion 62 with a predetermined gap provided between them.

Figure 3:
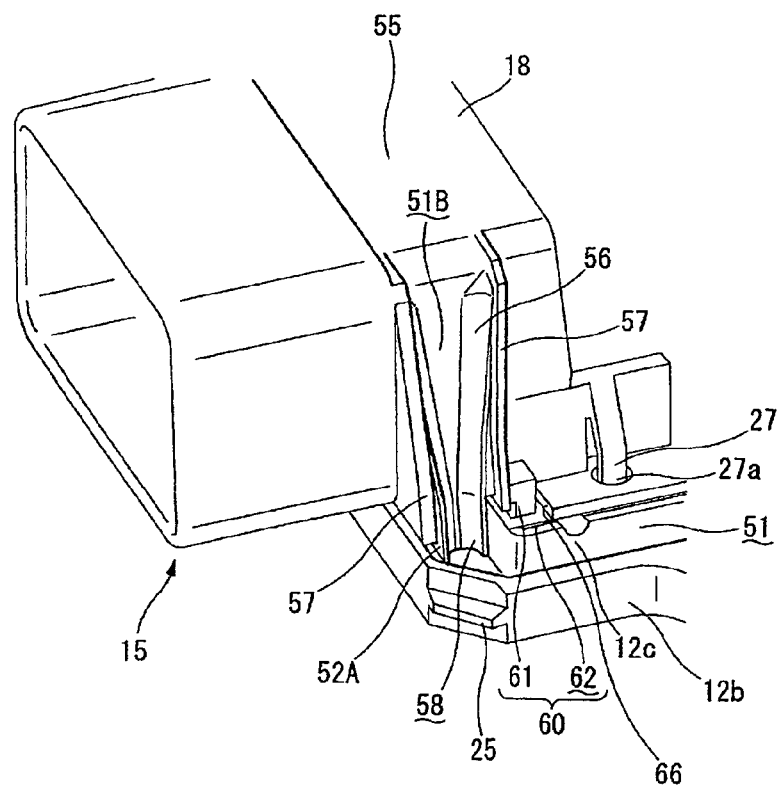
FIG. 3 is a perspective view of the connector part, with a cover removed, of the first embodiment.
Figure 5:
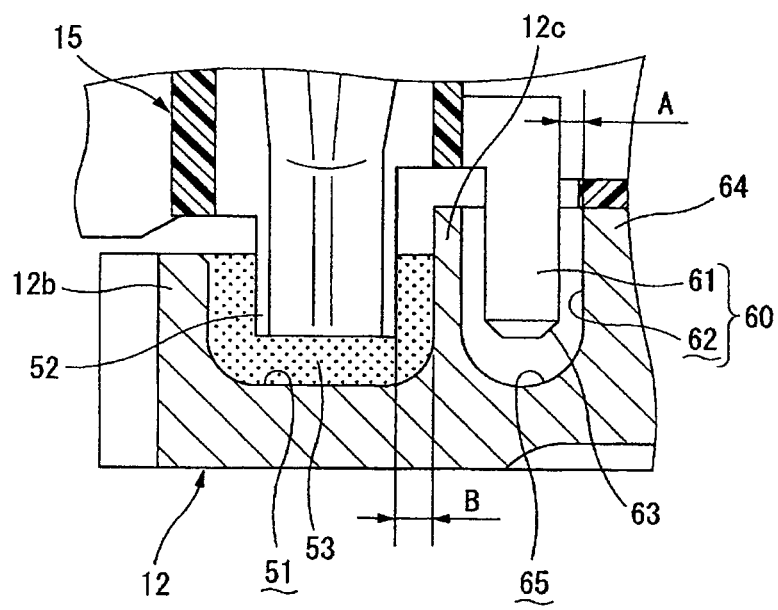
FIG. 5 is a sectional view showing a shift suppression unit and its surroundings, of the first embodiment.

The protruding portion 61 is formed integrally with both side portions at the lower surface side of the joining base 18 of the connector 15. More specifically, as shown in FIG. 3, the protruding portion 61 is formed at a back surface side of the rear-side rib 57 as an auxiliary part of the rear-side rib 57 that forms the seal groove 51 at the side surface side of the connector 15. The protruding portion 61 has a bar-shape whose cross section is rectangular and extends downwards. As shown in FIG. 5, a chamfer portion 63 having a properly inclined surface or curved surface is formed at a top end periphery edge of the protruding portion 61.

The hollow portion 62 is formed by using the auxiliary wall 12c that forms the side wall at the inner peripheral side of the seal groove 51 provided at the periphery edge of the case 12. More specifically, as shown in FIG. 1, the hollow portion 62 has a channel-shape that extends downwards with three sides of the hollow portion 62 substantially surrounded by a corner of the auxiliary wall 12c and an auxiliary rib 64 that extends inwards from the auxiliary wall 12c. A size in cross section of the hollow portion 62 is set to be larger than that of the protruding portion 61 so that the protruding portion 61 is fitted in the hollow portion 62 with the predetermined gap provided between them. Further, as shown in FIG. 5, in order to prevent the top end of the protruding portion 61 from locally touching and interfering with the hollow portion 62, a properly curved surface 65 is formed at a bottom of the hollow portion 62 in accordance with the shape of the chamfer portion 63 provided at the top end of the protruding portion 61.

Here, in order to prevent interference with the protruding portion 61, a cutting portion 66 is formed at a connector corner side of the circuit board 11. The protruding portion 61 is fitted in the hollow portion 62 through this cutting portion 66.

As explained above, in the present embodiment, the case 12, which is one of a pair of the connector sandwiching members sandwiching the connector 15 and is higher in rigidity than the other, and the connector 15 are provided with the shift suppression unit 60 suppressing the shift of the connector 15. Thus, as compared with a case where the shift suppression unit is provided at the cover 13 which is lower in rigidity than the case 12, the shift of the connector 15 with respect to the housing is effectively suppressed, and the load-carrying capacity is increased. Decrease in the sealing performance, caused by the shift of the connector 15, can therefore be suppressed.

In addition, since the case 12 and the cover 13 are different in rigidity, the cover 13 whose rigidity is low can be formed, as the integral member, by the synthetic resin material by the molding. Consequently, while ensuring the intended or desired load-carrying capacity by providing the shift suppression unit 60 at the higher-rigidity case 12 side, the weight reduction and the cost reduction can be achieved by the synthetic resin-formed lower-rigidity cover 13.

Next, a relationship between widths of the protruding portion 61 and the hollow portion 62 and widths of the seal groove 51 and the protruding line 52 of the seal portion 50 will be explained with reference to FIG. 5.

As shown in FIG. 5, a half value (½ value) of a difference between the widths of the protruding portion 61 and the hollow portion 62 is defined as a gap A between the protruding portion 61 and the hollow portion 62. A half value (½ value) of a difference between the widths of seal groove 51 and the protruding line 52 of the seal portion 50 is defined as a seal width B of the seal portion 50. A required minimum seal width at this seal portion 50 is defined as a required minimum seal width C. In the present embodiment, these values are set so as to satisfy the following relationship.

$A < B$ $C < B$ $(B-A) < C$

The shift suppression unit 60 also functions as a guide part when fixing the connector 15 to the housing by the fact that the protruding portion 61 is fitted in the hollow portion 62 with the predetermined gap A provided between them. Here, if the predetermined gap A is set to be greater than the seal width B, there is a possibility that, upon the fixing of the connector 15 to the housing, the fixing will be made with an eccentric fitting state in which one side surface of the protruding line 52 touches or is pressed against one side surface of the seal groove 51 occurring. In this case, the protruding portion 61 and the hollow portion 62 do not properly function as a positioning mechanism.

In contrast to this, in the present embodiment, since the predetermined gap A is set to be smaller than the seal width B, the protruding line 52 is fitted in the seal groove 51 while securing a certain gap between the both sides of the protruding line 52 and the respective opposing inner sides of the seal groove 51 in the state in which the protruding portion 61 is fitted in the hollow portion 62. Thus, a relative positioning of the seal groove 51 and the protruding line 52 can be achieved, and accuracy of the positioning upon the fixing can be improved.

Further, since the difference between the seal width B and the predetermined gap A is set to be smaller than the required minimum seal width C, even if the connector 15 moves or shifts with respect to the housing due to the external connector input when connecting the external connector to the connector 15, the protruding portion 61 touches or makes contact with the hollow portion 62 before the required minimum seal width at this seal portion 50 becomes the required minimum seal width C, then a further shift of the connector 15 can be suppressed or prevented. Thus, the required minimum seal width C is surely maintained, and the intended or desired sealing performance can be ensured.

Figure 6:
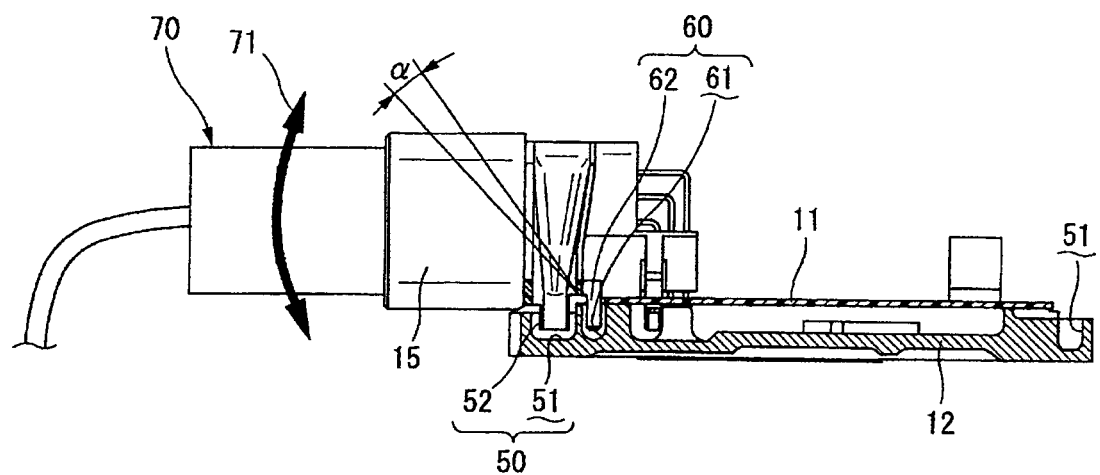
FIG. 6 is a drawing for explaining an acceptable swinging angle by an external force in a twisting direction.
Figure 7:
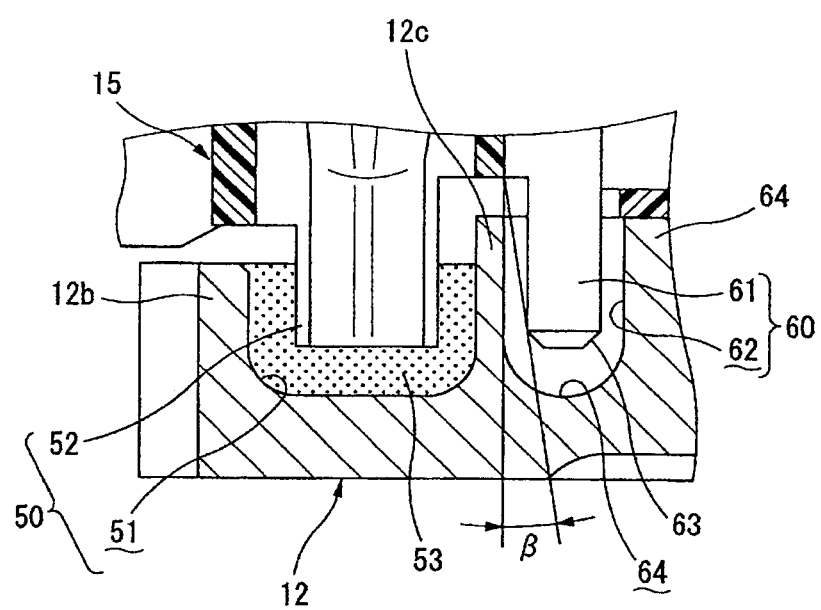
FIG. 7 is a sectional view showing the shift suppression unit and its surroundings, same as FIG. 5.

As shown in FIG. 6, when connecting the external connector 70 to the connector 15, an external force 71 in a twisting direction in which the connector 15 swings upwards and downwards (in FIG. 6, a circumferential direction shown by a double-headed arrow, with respect to an orthogonal direction of a paper of FIG. 6) is exerted on the connector 15. Then the connector 15 tends to move or shift to the twisting direction with respect to the housing by this external force 71.

In the present embodiment, the gap between the protruding portion 61 and the hollow portion 62 are set so that the shift of the connector 15 in the twisting direction is limited to within an angle that is less than an acceptable minimum specified swinging angle α. More specifically, a swinging angle β from an initial attitude shown in FIG. 7 to an inclination attitude of a contact state between the protruding portion 61 and the hollow portion 62 at their top end and lower end is set to be smaller than the specified swinging angle α (β<α). With this setting, even if the connector 15 shifts in the twisting direction with respect to the housing due to the external connector input when connecting the external connector to the connector 15, the protruding portion 61 touches or makes contact with the hollow portion 62 before the swinging angle β becomes the specified swinging angle α, then a further shift of the connector 15 can be suppressed or prevented. Thus, an excessive shift of the connector 15 is suppressed, and reliability and durability can be increased.

Further, especially at a merged part where the housing seal portion 50A and the connector seal portion 50B of the seal portion 50 are joined, the seal length is locally shortened, and it is difficult to ensure the sealing performance. However, in the present embodiment, since the shift suppression unit 60 is provided at such merged part, namely that since the shift suppression unit 60 is provided close to the corner portion of the connector both side portions and the connector lower surface side, the shift at the merged part of the seal portion where it is difficult to ensure the sealing performance is suppressed, and reliability and durability can be increased.

Figure 8:
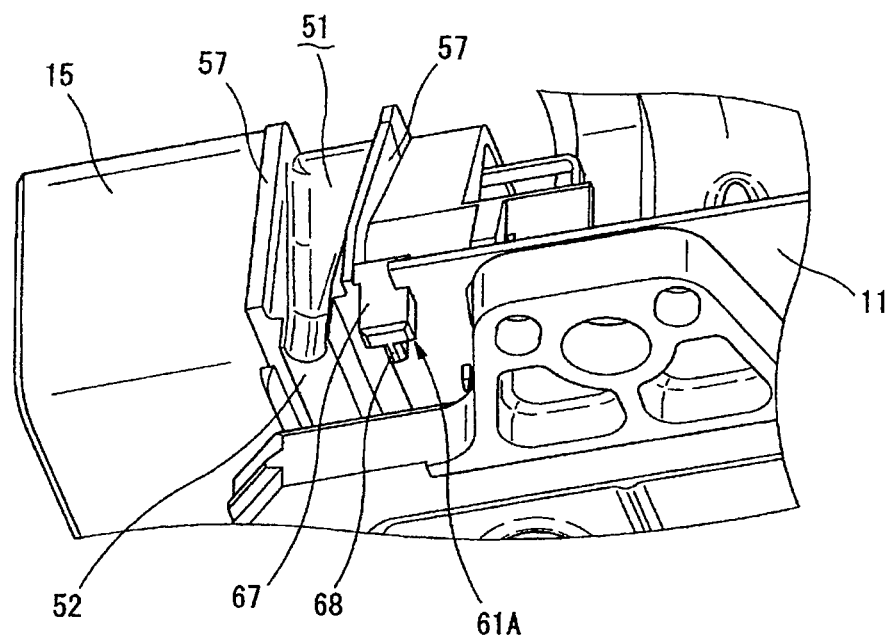
FIG. 8 is a perspective view showing a shift suppression unit and its surroundings, of a second embodiment.
Figure 9:
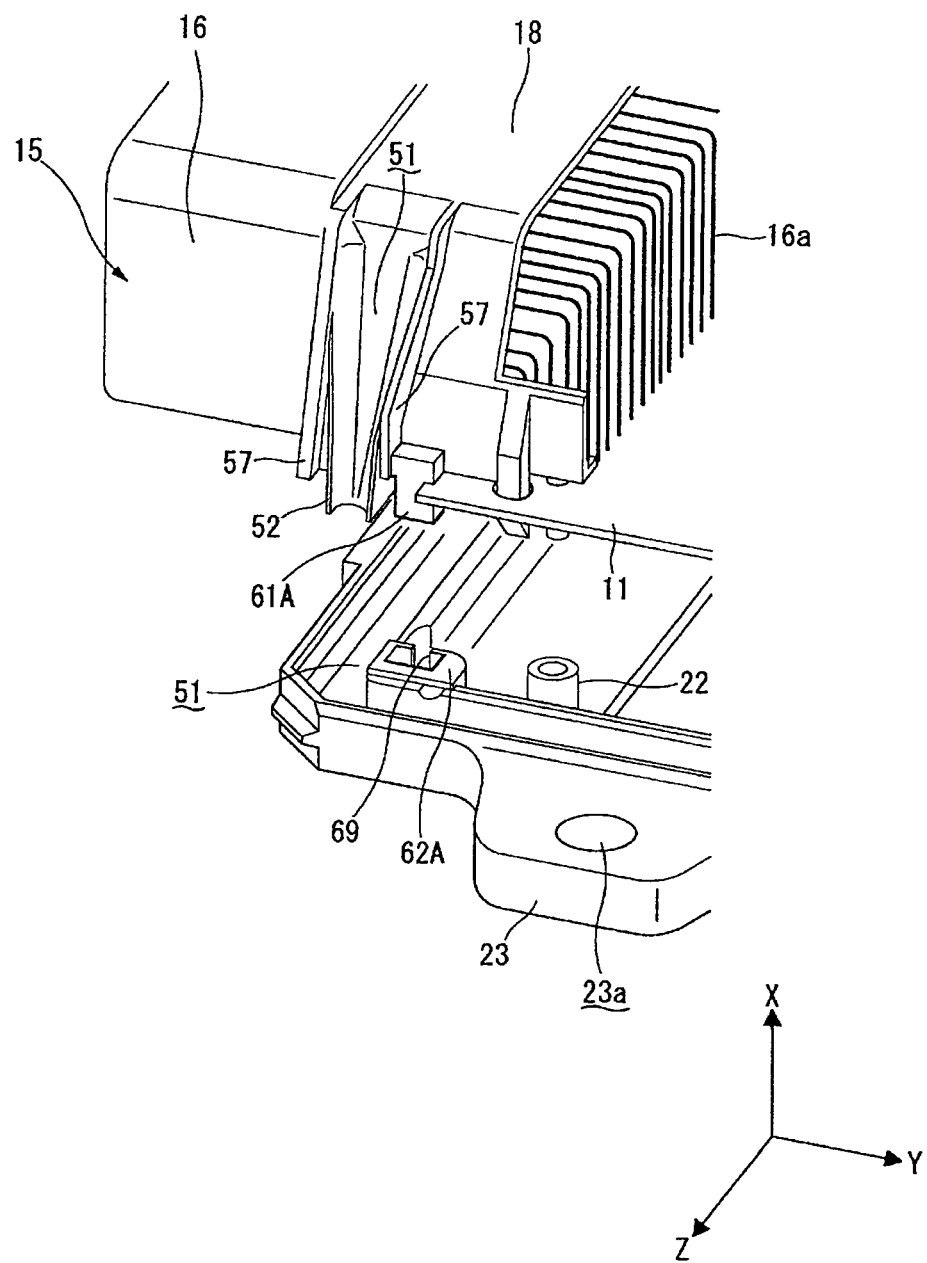
FIG. 9 is a perspective view showing the shift suppression unit and its surroundings, of the second embodiment.

FIGS. 8 and 9 are perspective views showing a protruding portion 61A and a hollow portion 62A of a second embodiment. The same components as the first embodiment are denoted by the same reference numbers, and an explanation of these components is omitted here.

In the second embodiment, shapes of the protruding portion 61A and the hollow portion 62A are different from those of the first embodiment. The protruding portion 61A has a first piece 67 having a rectangular shape in cross section and a second piece 68 having a rectangular shape in cross section and extending from a middle of the first piece 67. The protruding portion 61A is thus shaped like a letter "T" in cross section.

As for the hollow portion 62A, it is formed into a recessed rectangular shape in cross section, in which the first piece 67 is fitted with a predetermined gap provided between them, in accordance with the shape of the protruding portion 61A. In addition, a side surface of the recessed rectangular hollow portion 62A is provided with a slit 69 in which the second piece 68 is inserted and fitted with a predetermined gap provided between them.

As described above, by forming the protruding portion 61A into T-shape in cross section and providing the hollow portion 62A so as to fit to the protruding portion 61A, as compared with the first embodiment, the load-carrying capacity and the positioning accuracy with respect to X-Y direction orthogonal to the thickness direction of the circuit board 11 can be further increased.

Although the electronic control device according to the present invention has been explained on the basis of the above embodiments, the present invention is not limited to these embodiments.

For instance, the shapes of the protruding portion and the hollow portion of the shift suppression unit are not limited to the first and second embodiments, and a variety of shapes could be employed. Further, with respect to the position of the shift suppression unit, in the above embodiments, although the shift suppression unit is positioned close to the part where the housing seal portion 50A and the connector seal portion 50B are joined, the shift suppression unit could be provided at other portions.

The entire contents of Japanese Patent Application No. 2011-205475 filed on Sep. 21, 2011 are incorporated herein by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. An electronic control device comprising:
a circuit board to which, at one side thereof, a connector is fixed;
a housing having a pair of connector sandwiching members that sandwich the connector in a thickness direction, a part of the connector being exposed to an outside of the housing and a remaining part of the connector and the circuit board being housed in a watertight space of an inside of the housing, and one of a pair of the connector sandwiching members being set to be higher in rigidity than the other;
a seal portion formed at a fitting surface portion between periphery edges of a pair of the connector sandwiching members and at a fitting surface portion between an outer peripheral surface of the connector and an inner peripheral surface of the housing, the seal portion being filled with a sealant; and a shift suppression unit having fitting portions that are provided at the higher-rigidity connector sandwiching member and at the connector, the shift suppression unit suppressing a shift of the connector with respect to the housing by fitting of the fitting portions each other;

wherein the fitting portions of the shift suppression unit is a protruding portion formed at one side of the higher-rigidity connector sandwiching member and the connector and a hollow portion formed at the other side;

wherein the shift suppression unit functions as a guide part when fixing the connector to the housing by the fact that the protruding portion is fitted in the hollow portion with a predetermined gap provided between the protruding portion and the hollow portion; and wherein the predetermined gap between the protruding portion and the hollow portion is set to be smaller than a seal width of the seal portion filled with the sealant.

2. The electronic control device as claimed in claim 1, wherein:

when the predetermined gap between the protruding portion and the hollow portion is A, the seal width of the seal portion filled with the sealant is B, and a required minimum seal width at the seal portion is C, A, B and C satisfy a relationship of "(B−A)<C".

3. The electronic control device as claimed in claim 1, wherein:

the higher-rigidity connector sandwiching member is formed by metal material, and the lower-rigidity connector sandwiching member is formed by synthetic resin material.

4. The electronic control device as claimed in claim 1, wherein:

the shift suppression unit is positioned close to a part where the fitting surface portion between the periphery edges of a pair of the connector sandwiching members and the fitting surface portion between the outer peripheral surface of the connector and the inner peripheral surface of the housing are joined.

* * * * *